(12) United States Patent
Kamath et al.

(10) Patent No.: US 6,949,446 B1
(45) Date of Patent: *Sep. 27, 2005

(54) METHOD OF SHALLOW TRENCH ISOLATION FORMATION AND PLANARIZATION

(75) Inventors: Arvind Kamath, Mountain View, CA (US); Venkatesh P. Gopinth, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 135 days.

This patent is subject to a terminal disclaimer.

(21) Appl. No.: 10/457,942

(22) Filed: Jun. 9, 2003

Related U.S. Application Data (63) Continuation of application No. 09/885,497, filed on Jun. 19, 2001, now Pat. No. 6,617,251.

(51) Int. Cl.⁷ .............................................. H01L 21/76
(52) U.S. Cl. ...................... 438/424; 438/425; 438/433; 438/434; 438/714; 438/723; 438/756
(58) Field of Search ................................ 438/424–427, 438/433–437, 691–693, 714, 723, 745, 756

(56) References Cited

U.S. PATENT DOCUMENTS

| | | | |
|---|---|---|---|
| 3,644,180 A * | 2/1972 | Burock et al. .............. 205/125 |
| 4,471,525 A | 9/1984 | Sasaki | |
| 5,399,520 A | 3/1995 | Jang | |
| 5,512,509 A | 4/1996 | Han | |
| 5,665,635 A | 9/1997 | Kwon et al. | |
| 5,681,776 A | 10/1997 | Hebert et al. | |
| 5,923,993 A | 7/1999 | Sahota | |
| 6,100,162 A | 8/2000 | Doan et al. | |
| 6,114,218 A | 9/2000 | Jeng | |
| 6,194,285 B1 | 2/2001 | Lin et al. | |
| 6,207,517 B1 * | 3/2001 | Muller ....................... 438/301 |
| 6,245,635 B1 | 6/2001 | Lee | |
| 6,326,300 B1 * | 12/2001 | Liu et al. ..................... 438/638 |
| 6,432,797 B1 | 8/2002 | Cha et al. | |

FOREIGN PATENT DOCUMENTS

| | | |
|---|---|---|
| JP | 62-014439 | 1/1987 |
| JP | 01-282839 | 11/1989 |

* cited by examiner

Primary Examiner—Duy-Vu N. Deo
(74) Attorney, Agent, or Firm—Beyer Weaver & Thomas, LLP (57) ABSTRACT

Provided is a technique for fabrication of STIs in a semiconductor device using implantation of damaging high-energy ions to insulating material overburden to generally and/or selectively increase insulation overburden removal rates. This technique avoids the use of chemical mechanical planarization (CMP) with a combination of implantation and, in some instances, low cost batch etching. The electrical characteristics of devices created with the new technique match closely to those fabricated with the standard CMP-based technique.

10 Claims, 11 Drawing Sheets

Implanted

Normal

METHOD OF SHALLOW TRENCH ISOLATION FORMATION AND PLANARIZATION

This application is a continuation of U.S. application Ser. No. 09/885,497, filed Jun. 19, 2001, now U.S. Pat. No. 6,617,251.

BACKGROUND OF THE INVENTION

1. Field of the Invention

The present invention relates to shallow trench isolation (STI) processes employed in the fabrication of integrated circuits (ICs). The present invention more particularly relates to an improved process for the formation and planarization of shallow trench isolated devices (henceforth referred to as STIs) without the use of chemical mechanical planarization (CMP).

2. Description of the Related Art

As IC technology has moved to smaller feature sizes and the density of IC features in an IC substrate surface increases, STI processes have replaced the local oxidation of silicon (LOCOS) isolation methods as the process of choice for isolating active areas in Metal Oxide Semiconductor Field Effect Transistor (MOSFET) devices, for example. Local oxidation of silicon (LOCOS) isolation methods are undesirable at sub-0.5 μm dimensions and lower because they typically introduce non-planarity and a "bird's beak" at the edge of an active area and therefore reduce the packing density of the circuitry. In contrast, STI processes provide isolation schemes that produce a relatively high degree of planarity and eliminate the bird's beak to dramatically reduce the chip area required for isolation.

Figure 1A:
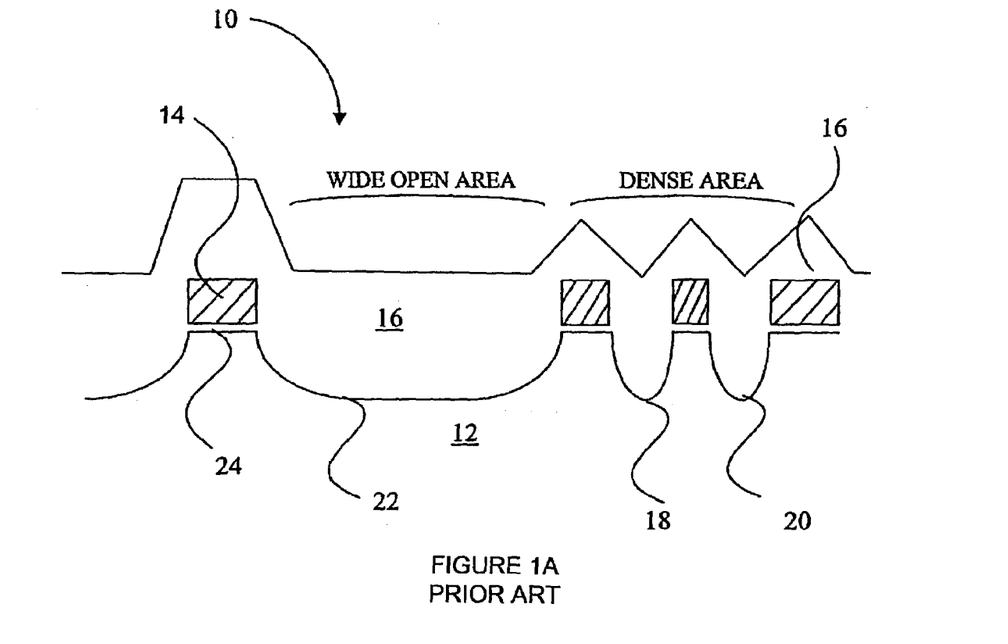
FIGS. 1A–1C show some major steps of a conventional shallow trench isolation process.
Figure 1B:
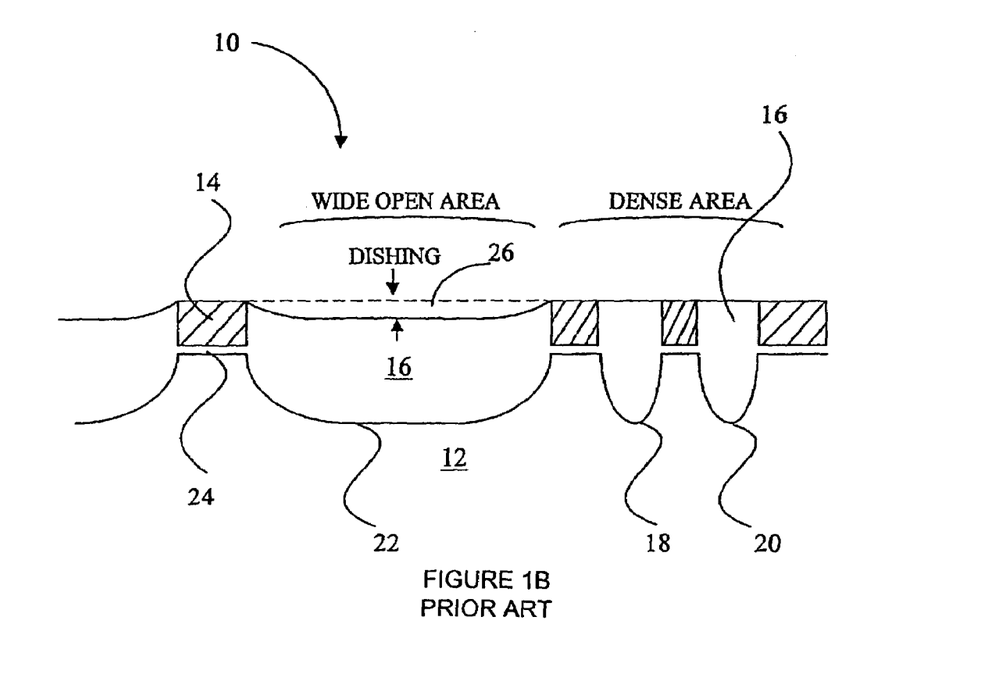
Figure 1C:
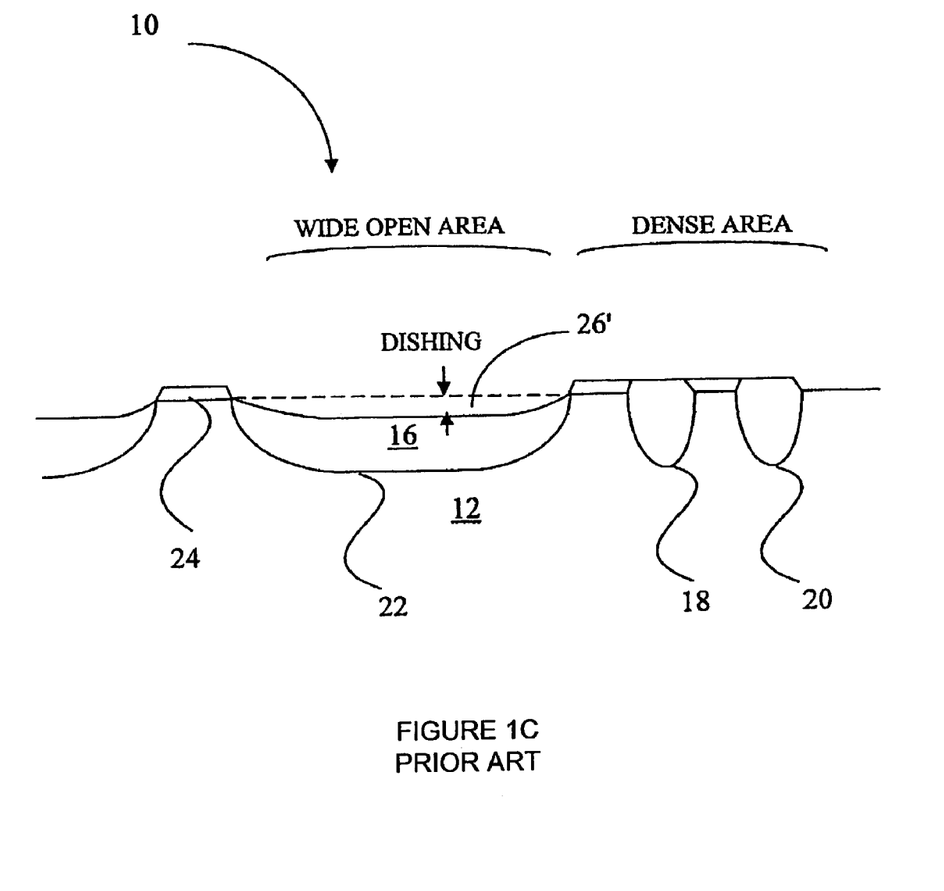

FIGS. 1A–C show some major steps of a conventional STI process that may be employed to fabricate trenches in the IC substrate. In order to form a partially fabricated IC substrate 10 (hereinafter referred to as "IC substrate") as shown in FIG. 1A, a pad oxide layer 24, e.g., a silicon dioxide layer, is blanket deposited or grown on a surface of an IC substrate layer 12. A polishing stopping mask layer 14, e.g., a silicon nitride layer ($Si_3N_4$), is then blanket deposited over pad oxide layer 24.

Next, polishing stopping layer 14, pad oxide layer 24 and IC substrate layer 12 are etched through using conventional photolithography and etch techniques well known to those skilled in the art to form trenches 18, 20 and 22 in IC substrate layer 12. Trench 22 is formed in a relatively wide open area in which relatively wide active areas, also referred to as wide diffusion areas or wide island areas, are isolated by relatively wide STIs, and trenches 18 and 20 are formed in a relatively dense area of IC substrate 10. The dense area, as shown in FIG. 1A, has a greater number of trenches per unit area of the IC substrate surface than the wide open area.

Following trench formation, the trenches are typically cleaned using combinations of conventional dry and wet chemistry and the trench side walls oxidized to form a liner, typically a few hundred Angstroms thick, to repair any damage caused by the plasma used in etching the trench. Typically, a few 100 A can be grown wet or dry, with or without HCL. This oxide liner also provides a base for the subsequent insulation deposition.

Then an insulating layer 16, e.g., a silicon dioxide layer, is deposited, for example by chemical vapor deposition (CVD), high density plasma (HDP) deposition, or spin-on glass (SOG), on the IC substrate 10 filling trenches 18, 20 and 22 with the insulating layer so that subsequently formed active areas in IC substrate 10 are electrically isolated from each other. As shown in FIG. 1A, a portion of insulating layer 16 is also deposited above polishing stopping layer 14 and this portion of insulating layer 16 is referred to as the "insulating layer overburden."

IC substrate 10 is then subject to chemical-mechanical polishing (CMP) to remove the insulating layer overburden and polishing stopping layer 14. CMP typically involves mounting an IC substrate on a holder and rotating the IC substrate face against a rotating polishing pad. Those skilled in the art will recognize that because insulating layer 14 typically includes $SiO_2$, "oxide CMP" (which refers to the CMP process for polishing $SiO_2$) is typically carried out in this step. During oxide CMP, a slurry composition is introduced between the polishing pad and an IC substrate surface.

Variations of this conventional processing exist including the use of a trench planarization mask to expose certain areas of the insulator overburden to etching prior to the CMP planarization. The trench planarization or "reverse" mask is typically generated from the existing active area definitions by a series of logical operations which include undersizing the generated reverse layer to be completely inside the underlying active area for all process conditions including, but not limited to, photolithography misalignment and CD targets. The result of this reverse/trench planarization etch step is a small but uniform amount of insulator in all regions making, in general, the overall polishing, and in particular, the polishing of wide active areas, faster and more reliable. Also, densification of the deposited oxide fill to improve the film quality can be done in an inert atmosphere, or in oxygen, in which case the liner oxidation may be bundled into this densification step.

FIG. 1B shows an intermediate structure that is formed during oxide CMP after the insulating layer overburden is removed and polishing stopping layer 14 is exposed. The resulting profile of the insulator layer 16 plays an important role in device characteristics including, but not limited to, isolation and well characteristics. Generally, the top of insulator layer 16 after CMP, is designed to be above the top of pad oxide layer 24 so as to prevent uncontrolled "pad oxide undercut" during subsequent processing steps. This pad oxide undercut could result in undesirable device variation.

As shown in FIG. 1B, after the insulating layer overburden is removed, the surface of insulating layer 16 above trenches 18 and 20 is substantially planar. Above trench 22, however, near or about a middle region of the surface of insulating layer 16 (in the wide open area), a concave or indented region 26 may be formed. Concave region 26 recesses inwardly into the surface of insulating layer 16 and is referred to as "dishing" because the profile of the concave region resembles the profile of a dish. The degree of dishing can be quantified by measuring the distance between the center of the surface of insulating layer 16 (above trench 22), which is typically the lowest point of the concave region, and the point where the insulating layer levels off, which is typically the highest point of the concave region.

After oxide CMP has concluded and polishing stopping layer 14 is removed, isolation structures (i.e., trenches 18, 20 and 22 filled with insulating material 16) are formed below the IC substrate layer 12 surface. A pad oxide layer 24, with the appropriate thickness, is maintained above the IC substrate layer surface and the substantially planar surface of insulating layer 16 above trenches 18 and 20 is preserved, as shown in FIG. 1C. The degree of dishing, however, in the wide open area above trench 22 may increase and the resulting concave region shown in FIG. 1C by reference numeral 26' may recess inwardly into the surface of insulating layer 16 to a greater extent because during oxide CMP a material removal rate of the insulating layer (e.g., $SiO_2$) is higher than a material removal rate of the polishing stopping layer (e.g., $Si_3N_4$). Thus, oxide CMP has a high selectivity to the polishing stopping layer. After the isolation structures shown in FIG. 1C are formed the IC fabrication process typically proceeds to forming IC features of active areas, e.g., transistor devices.

Unfortunately, the conventional STI process described above can lead to device behaviors that are not uniform across the wafer/die, leading to pattern dependence. By way of example, the undesirable dishing effect described above can lead to device behaviors (including, but not limited to, total implants received by the well) to vary according to pattern density. Another problem is the presence of "poly stringers," remnants of deposited polysilicon, that could not be removed efficiently from all areas due to non-uniform polishing. Yet another potential drawback from the abrasive CMP process are "microscratches," gouges that occur in the insulating layer 22, which can grow during subsequent unrelated cleans/etches and can trap conducting materials leading to shorting unrelated devices.

What is therefore needed is an improved STI process that avoids these drawbacks and efficiently and cost-effectively produces isolation structures or trenches filled with an insulating material having substantially planar surfaces that effectively isolate active areas in an IC from each other.

SUMMARY OF THE INVENTION

To achieve the foregoing, the present invention provides a technique for fabrication of STIs in a semiconductor device using implantation of damaging high-energy ions to insulating material overburden to generally and/or selectively increase insulation overburden removal rates. This technique avoids the use of chemical mechanical planarization (CMP) with a combination of implantation and, in some instances, low cost batch etching. The electrical characteristics of devices created with the new technique match closely to those fabricated with the standard CMP-based technique.

In one aspect, the invention provides a process for forming a shallow trench isolation in a semiconductor device. The process involves forming a pad oxide layer on the surface of a silicon substrate, forming an etch stop layer on the pad oxide, forming a shallow trench in the substrate, and depositing an insulating fill in the trench. The insulating fill has an overburden (thickness of insulating film above the polish stop layer atop active areas in the substrate). A mask exposing regions of the overburden is formed on the insulating fill, and exposed regions of the insulating fill overburden are implanted with insulating fill-damaging ions before the mask is removed. The insulating fill overburden is then removed by etch so that the regions of implanted insulator overburden are removed more rapidly that than non-implanted regions under the same removal conditions. The process may be tailored so that the etch stop layer underlying all regions of the insulator overburden is reached substantially simultaneously while the insulator level in the trench remains above the pad oxide.

These and other features of the present invention will be described in more detail below in the detailed description of the invention and in conjunction with the following drawings.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides shallow trench isolation (STI) processes that avoid dishing and efficiently and cost-effectively produce isolation structures or trenches filled with an insulating material having substantially planar surfaces that effectively isolate active areas in an IC from each other. Processes in accordance with the present invention use implantation of damaging high-energy ions to insulating material overburden to generally and/or selectively increase insulation overburden removal rates. This technique avoids the use of Chemical Mechanical Planarization (CMP) with a combination of implantation and low cost batch etching. The electrical characteristics of devices created with the new technique match closely to those fabricated with the standard CMP-based technique.

In accordance with the present invention then, the removal of unwanted material in the course of semiconductor device fabrication is facilitated by damaging some or all of the material to be removed by ion implantation. According to this technique, removal rates are increased for a given removal process, and/or the removal rate of material across the surface of a semiconductor wafer may be tailored for a particular purpose. One particularly useful application of the technique of the present invention is to the removal of insulating material overburden (thickness of insulating film above the polish stop layer atop active areas in a semiconductor substrate) in STI processing, as described in further detail below. The invention, however, may also be applicable in a number of other semiconductor processing situations, for example, processes involving the selective removal of material from some areas while keeping removal in other areas at a minimum.

Figure 2A:
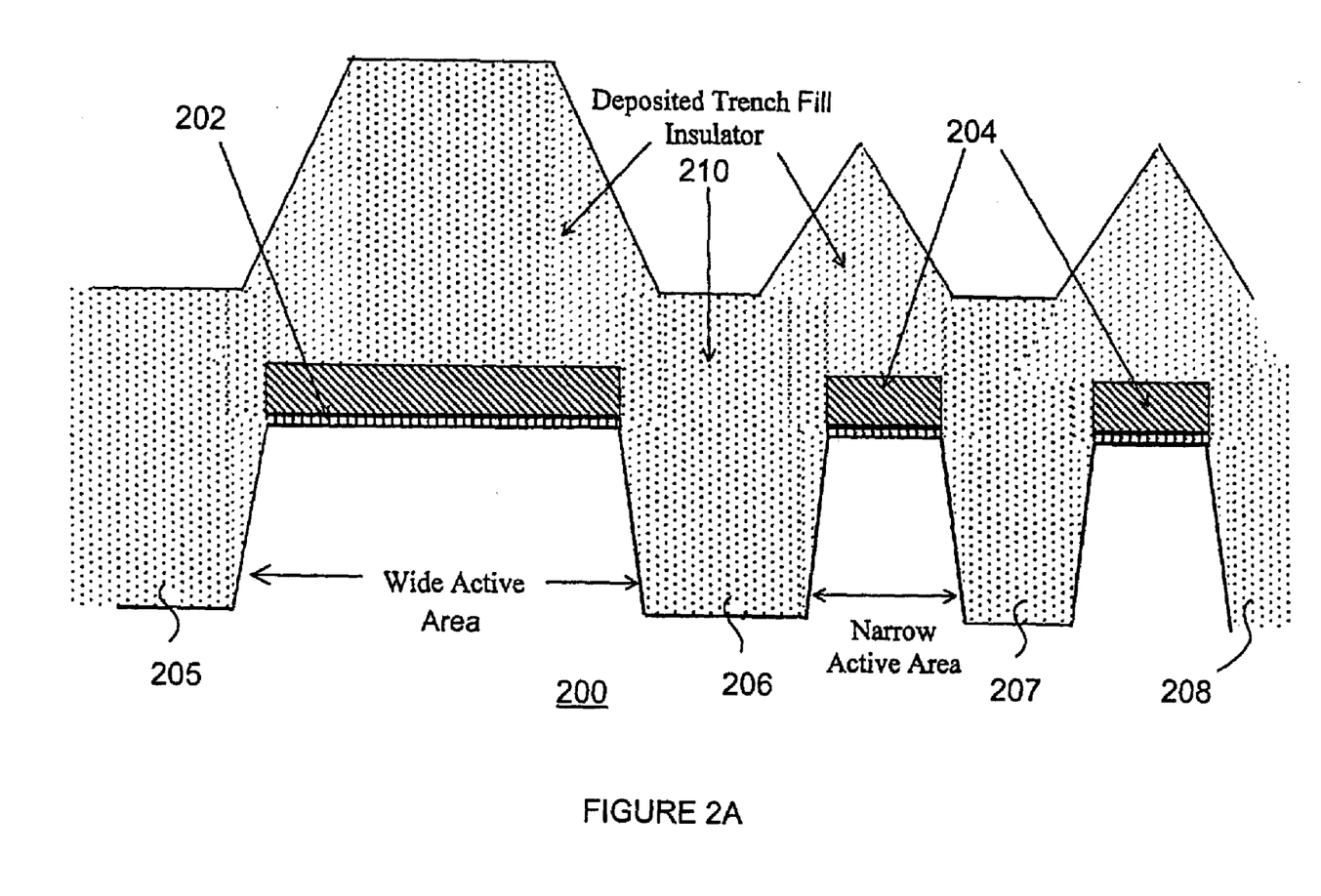
FIGS. 2A–2C show some major steps of a shallow trench isolation process, according to one embodiment of the present invention.
Figure 2B:
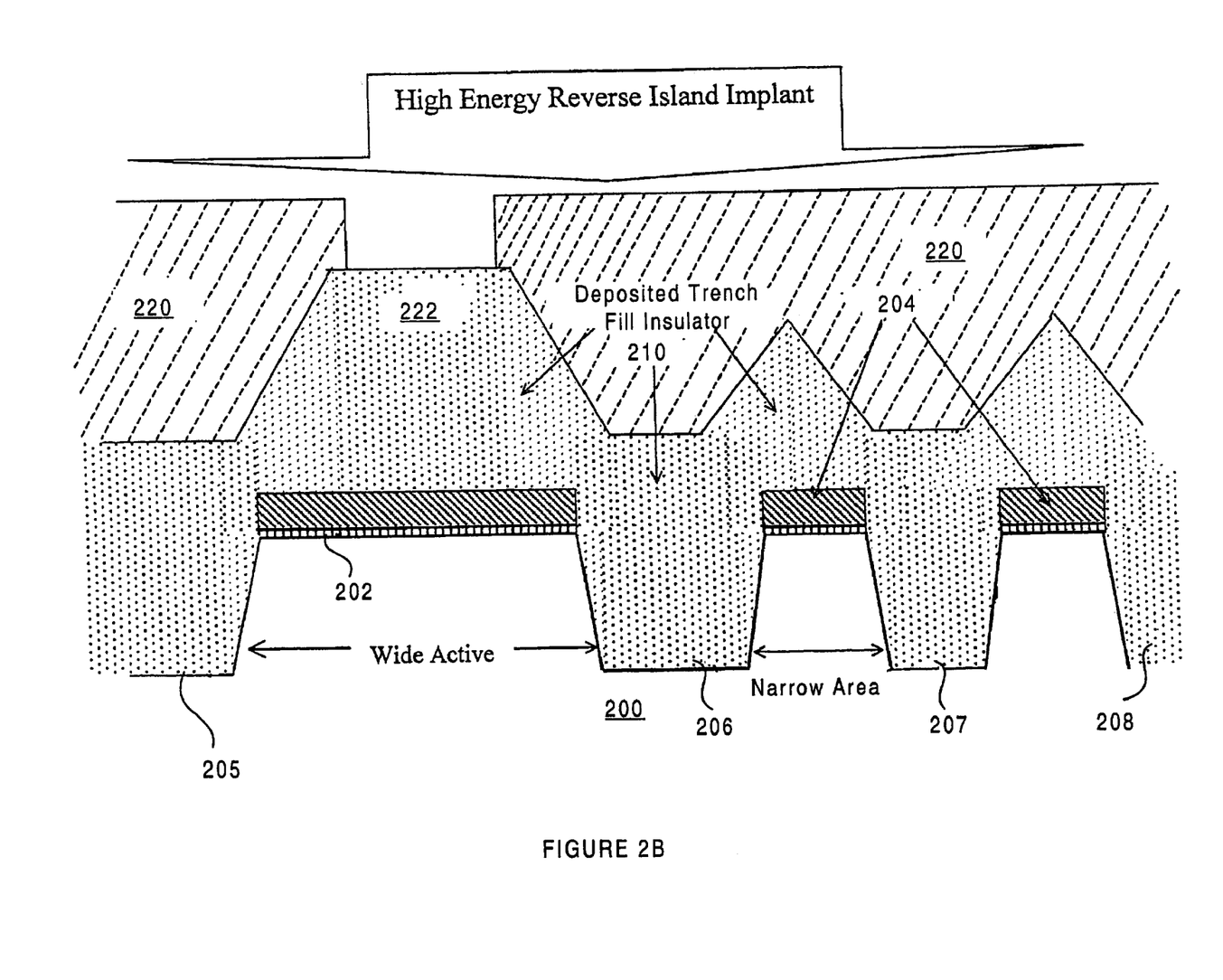
Figure 2C:
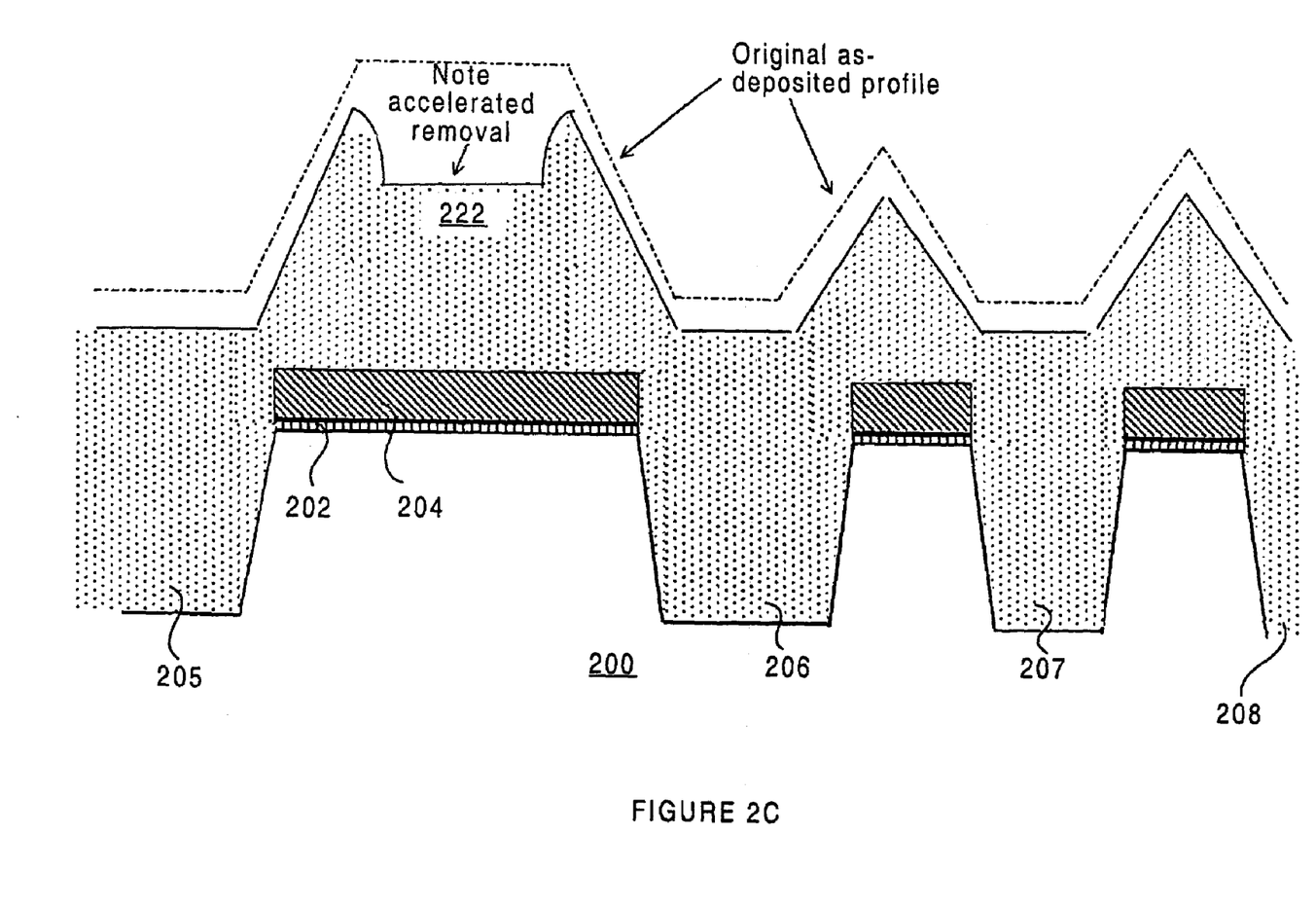

FIGS. 2A–2C show some major steps of a shallow trench isolation process, according to one embodiment of the present invention. In order to form partially fabricated integrated circuit (IC) 200 as shown in FIG. 2A, a pad oxide layer 202, e.g., a silicon dioxide layer, is blanket deposited or grown on a surface of an IC substrate 200. An etch stop layer 204 is then blanket deposited over pad oxide layer 202. The material for the etch stop layer 204 is chosen so that there will be selectivity between the insulator and the etch stop to facilitate end point determination when the overburden is removed to ensure that an appropriate thickness of subsequently applied insulator layer 210 above the pad oxide layer 202 is maintained. The etch stop material may include at least one of silicon nitride ($Si_3N_4$) and silicon oxynitride (e.g., $SiO_xN_y$ or SiON). The thickness of etch stop layer 204 may vary depending on various factors, e.g., etchant selectivity to the etch stop layer relative to the insulating layer, stress applied by the etch stop layer on the silicon substrate, or the ability of the insulating material to fill subsequently formed trenches having the appropriate aspect ratio. In one embodiment, however, etch stop layer 204 has a thickness that is between about 1000 and about 3000 Angstroms (Å).

After formation of the pad and stop layers, the island (or active or diffusion) regions may be formed in the substrate for example by conventional photolithographic and doping processing techniques. The active areas in the substrate may alternatively be formed at other stages of the fabrication process, including before formation of the pad and stop layers, or after formation of the trenches, described below. Next, etch stop layer 204, pad oxide layer 202 and IC substrate 200 are etched through using conventional photolithography/etch techniques well known to those skilled in the art to form trenches 205, 206, 207 and 208 to electrically isolate the various active areas in IC substrate 200. Trench 205 is formed in a relatively wide open area in which relatively wide active areas, also referred to as wide diffusion areas or wide island areas, are isolated by relatively wide STIs, and trenches 206, 207 and 208 are formed in a dense area of IC substrate 200. The dense area, as shown previously in FIG. 1A, has a greater number of trenches per unit area of the IC substrate surface than the wide open area.

Following trench formation, the trenches are typically cleaned using combinations of conventional dry and wet chemistry and the trench side walls oxidized to form a liner, typically a few hundred Angstroms thick, to repair any damage caused by the plasma used in etching the trench. Typically, a few 100 Å can be grown wet or dry, with or without HCL. This oxide liner also provides a base for the subsequent insulation deposition.

Then an insulating trench fill layer 210, e.g., a silicon dioxide layer, is deposited, for example by chemical vapor deposition (CVD), high density plasma (HDP) deposition, or spin-on glass (SOG), on the IC substrate 200 filling the trenches 205, 206, 207 and 208 with the insulating layer so that the active areas in IC substrate 200 are electrically isolated from each other. As shown in FIG. 2A, the insulating layer 210 generally includes a portion, the insulating layer overburden, deposited above the etch stop layer 204.

In accordance with the present invention, this insulating overburden is not removed by a CMP-based process. Instead, as shown in FIG. 2B, a damaging ion implant mask layer 220 is applied over the substrate and patterned to expose portions of the insulating overburden. At this point, it should be noted that island areas narrower than a certain width (determined by the insulator deposition characteristics) will have substantially conical profiles while those wider than this dimension will have substantially flat tops. Generally, insulator (e.g., oxide) regions with sharp corners (implanted or otherwise) etch much faster than their flat counterparts. This behavior is exploited in embodiments of the present invention to ensure clearance of insulator on top of etch stop over all regions of the substrate surface, regardless of profile. Generally then, the damaging ion implant mask 220 is patterned so as the expose the wider, flat top regions of insulator overburden overlaying the wide actives.

A high energy ion implant is then conducted over the substrate, implanting damage-causing ions into the exposed region(s) 222 of the insulator overburden. This implant is sometimes referred to as a "reverse island implant" (and the associated mask as a "reverse mask") because it reverses (i.e., exposes) areas to the damaging high energy implant after photoresist development. The mask is designed to account for process variation arising from, but not limited to, photolithography and implant steps.

In one embodiment, Nitrogen (N) ions may be implanted into a typical silicon dioxide overburden at a dose of about $3.5e^{14}$ atoms/cm$^2$ and an energy of about 170 KeV. However, the dose and energy of the implant is determined based on the nature and thickness of the insulator material, as described more fully below. Also, elements other than Nitrogen may be implanted. Any element suitable for ion implantation to cause structural damage to an insulator material such that it is more rapidly removed by a subsequent etching process may be used. One possible alternatives to N is Argon (Ar).

Variations on the inventive process are also possible. For example, a partial etch of the wide active regions with the reverse mask in place may be conducted to provide a bigger differential between reversed (implanted) and un-reversed (un-implanted) areas. Then the mask may be removed and the entire wafer surface may be etched. According to another variation, a blanket unmasked lower energy (for example 25 KeV) damaging implant may be conducted prior to application of the reverse mask to accelerate etch over the entire surface to generally accelerate throughput. For thicker oxides, a further variation on this approach is to use "chained" (also referred to in the art as "ganged") implants, i.e., several implants of increasing energy, so as to damage the oxide uniformly along its entire depth. The masking layer is then removed by wet etching or ashing, for example.

Following the implant, a etching technique is used to remove the insulator overburden. The etch technique may be a dry etch protocol, such as a plasma etch, or a wet etch protocol. Wet etching is particularly advantageous in that it may be conducted as a batch process with attendant time and cost savings. In one embodiment, a long HF etch is used. Other etchant solutions (e.g., BOE, $NH_4$ F or KOH) may also be used with similar anticipated results. Generally, a batch of e.g. fifty or more wafers prepared as described above may be placed in a wet etch (for example, HF) bath to remove the insulator overburden over the etch stop (e.g., nitride) layer over the active areas, while keeping the level of the insulator fill in the trenches between the actives above the level of the pad oxide. According to this embodiment, the expensive single wafer expensive CMP-based process is replaced with a less expensive wet etch bath batch process. FIG. 2C demonstrates the evolution of the insulator material profile in the implanted and un-implanted regions noting that the two etch at vastly different rates.

Following the etch stage, the etch stop layer is stripped, for example by conventional procedures such as using hot phosphoric acid. It should also be noted that the etch stop strip process can be bundled into one stage with the etch process with the appropriate batch wet sink tools. This variation allows for further savings in capital and running costs during normal production operation.

Figure 3A:
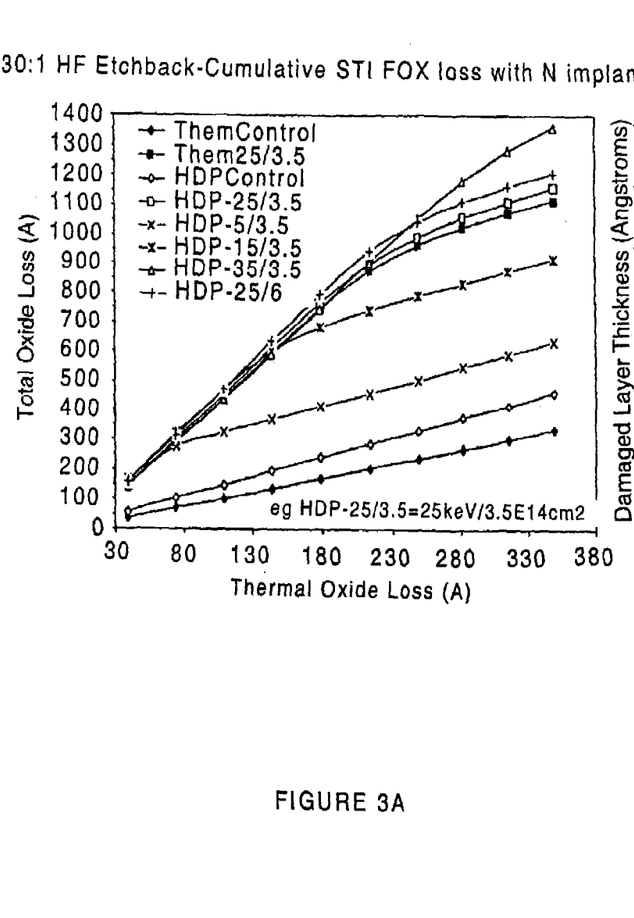
FIGS. 3A–3B depict graphs showing the etch characteristics of ion implant damaged oxides which support shallow trench isolation processes in accordance with the present invention.
Figure 3B:
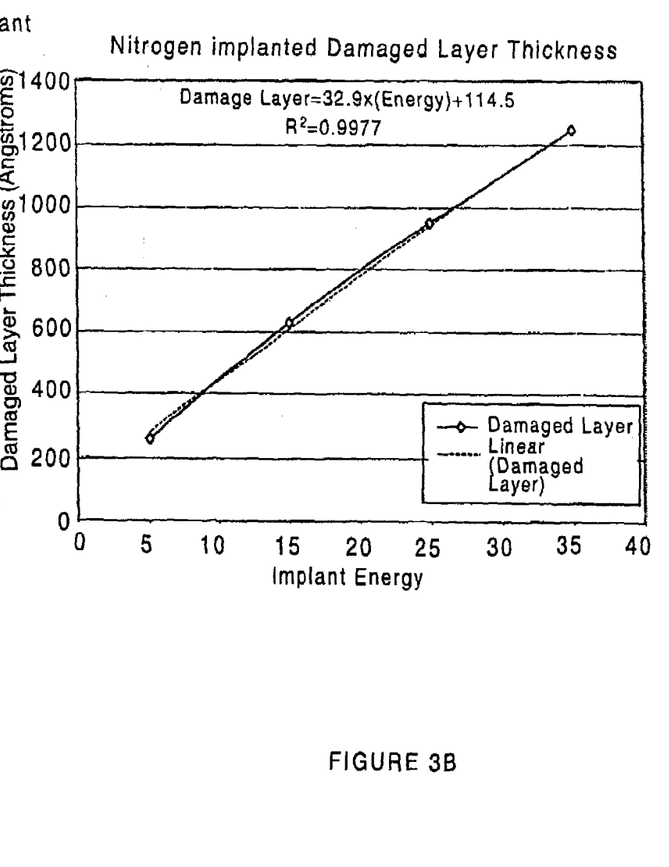

FIGS. 3A–3B depict graphs showing the etch characteristics of ion implant damaged and undamaged oxides which support shallow trench isolation processes in accordance with the present invention. Silicon Oxides implanted with energetic ions show an increase in wet HF etch rate over non-implanted (undamaged) oxides. Results of a study using Nitrogen ions on silicon dioxide are shown in FIGS. 3A and 3B. The damaged oxide etch rate increased by a factor of about three over undamaged oxides once a critical implant dose is exceeded. The depth of the damaged oxide is linearly proportional to the implantation energy and the increased etch rate drops back to normal after this damaged layer is removed.

FIG. 3A shows the extent of damage for energies ranging from 5 KeV to 35 KeV, and Nitrogen dose ranging from 3.5E14/cm2 to 6E14/cm2. FIG. 3B shows that the damage depth is a linear function of the implant energy and is given by the equation shown on FIG. 3B.

Figure 4:
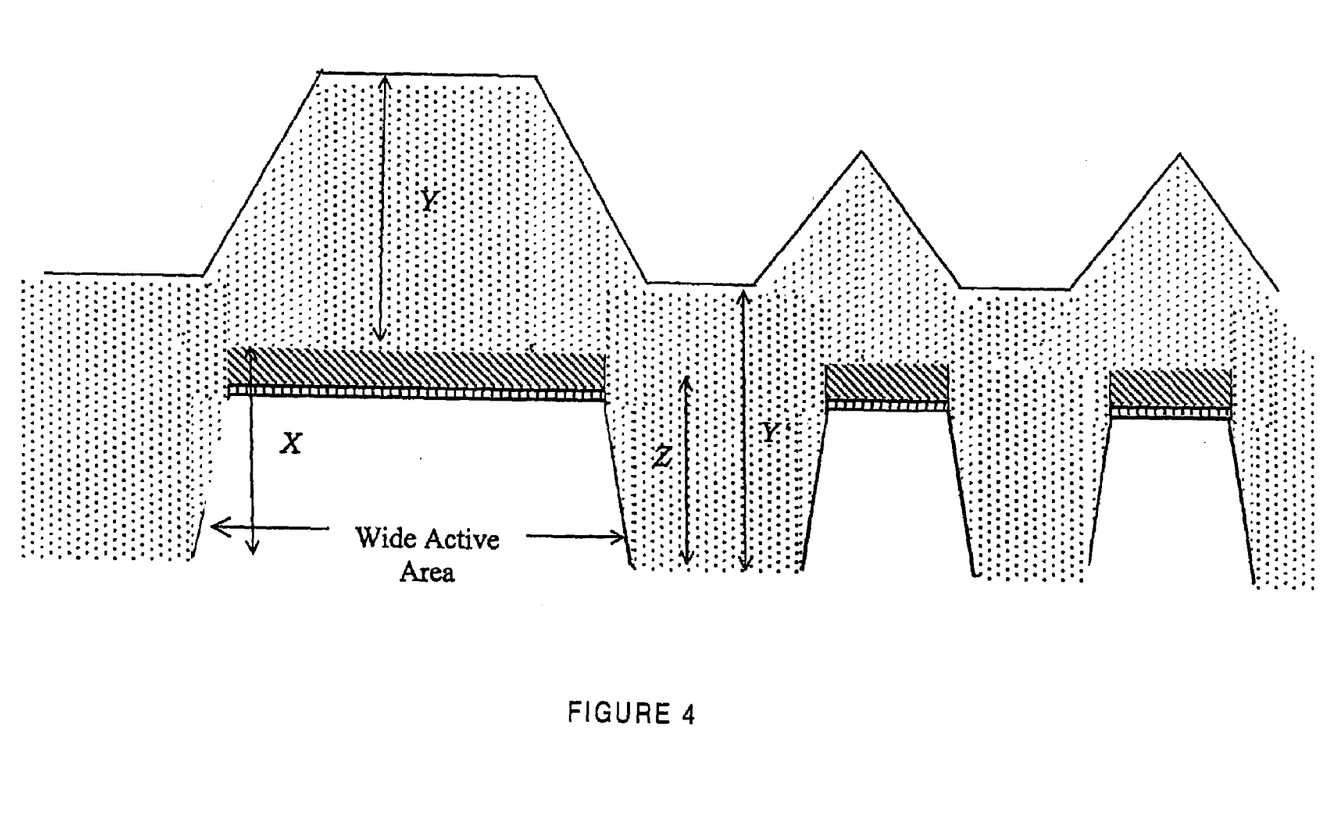
FIG. 4 illustrates aspects of the implant energy calculation used according to one embodiment of the present invention.

FIG. 4 illustrates aspects of the implant energy calculation used according to ne embodiment of the present invention. The calculation is for an optimal energy hat will allow for all insulator (e.g., oxide) atop the etch stop (e.g., nitride) to be removed, while the level of the insulator remaining in the trench(s) (Z) (FIG. 5) is above the pad oxide. From the data obtained in connection with the results presented above in connection with FIGS. 3A and 3B, the following relationship has been determined for silicon dioxide implanted with Nitrogen and etched in an HF bath:

The damaged layer depth=32.9×($N_{14}$ Implant energy [keV])+114.5 Å.

Referring to FIG. 4, X=total trench depth; Y=total depth of oxide; and Z=thickness of remaining insulator in the trench. When Y Angstroms (Å) of oxide is removed on top of the etch stop layer, Y-Z Å is removed in the trench at an as-deposited etch rate.

=>Y-Z=Y/3=>Z=2/3Y

Y-225=32.9*E+114.5=>E=(Y-339.5)/32.9

For example, if X=5000 Å, Y=6000 Å=>E~170 KeV and Z=4000 Å.

The thickness "Z" should be above the pad oxide level. Any further control of "Z" may be done independently for pillar height (i.e., the difference between the top of insulator in trench and the top of field oxide) control purposes. For thicker insulators/higher energies, a chained implant scheme of varying energies, up to the maximum required, may be employed to uniformly damage (i.e., increase etch rate) over the desired thickness of the insulator overburden.

As noted above, the present invention may be practiced with implantation of ions other than Nitrogen and/or insulator materials other than silicon dioxide. Given the guidance provided herein, one of skill in the art would be able to perform the equivalent calculation for alternative materials with minimal experimentation and thereby optimize that application of the present invention using such alternative materials.

STI processes in accordance with the present invention represent a marked improvement over the conventional STI process described above. STI integration in accordance with the present invention uses damaging high-energy ions to selectively increase oxide removal on top of etch stop covering active areas. This scheme avoids the use of chemical mechanical planarization (CMP) with a combination of implantation and, in one embodiment, a low cost batch wet etch. The electrical characteristics of devices created with the new scheme match closely to those fabricated with the standard CMP scheme.

EXAMPLES

The following examples provide results demonstrating the effectiveness of STI processing techniques in accordance with the present invention. It should be understood the following is representative only, and that the invention is not limited by the detail set forth in this example. The results of these experiments demonstrate the effectiveness of the a technique in accordance with the present invention for a standard 0.18 um, 8" process. The technique is easily scaleable to other technologies.

Figure 5A:
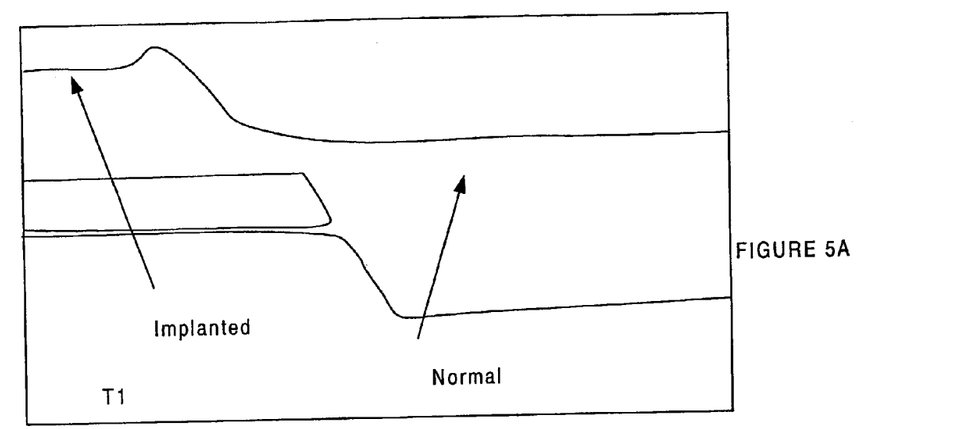
FIGS. 5A–5C depict scanning electron micrographs of vertical cross-sections of semiconductor wafers processed according to one embodiment of the present invention showing the evolution of oxide removal on wide areas with increasing HF etch time (T3>T2>T1).
Figure 5B:
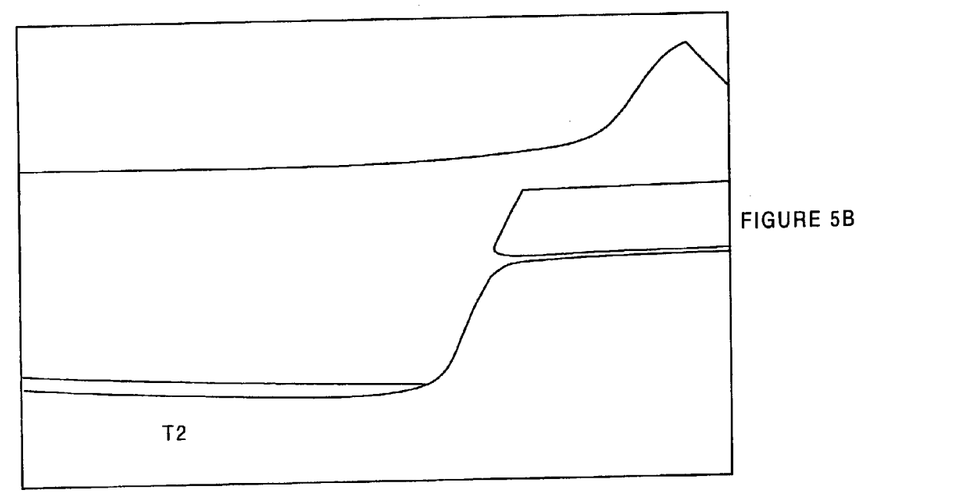
Figure 5C:
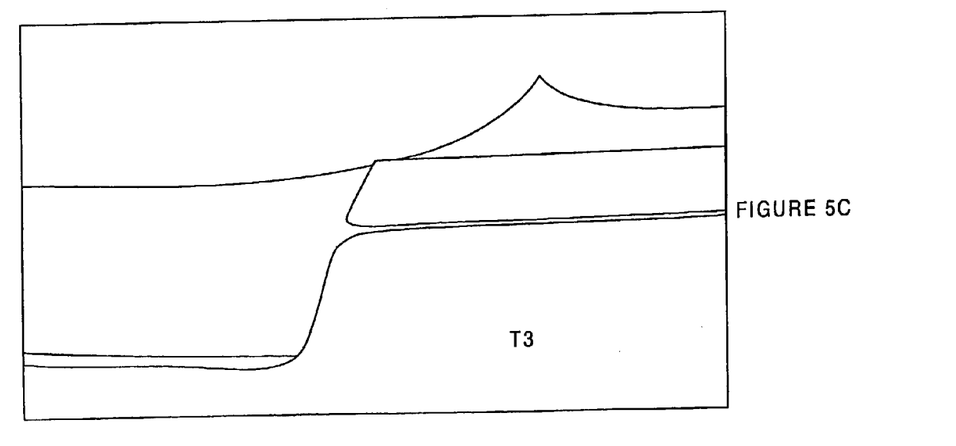
Figure 6A:
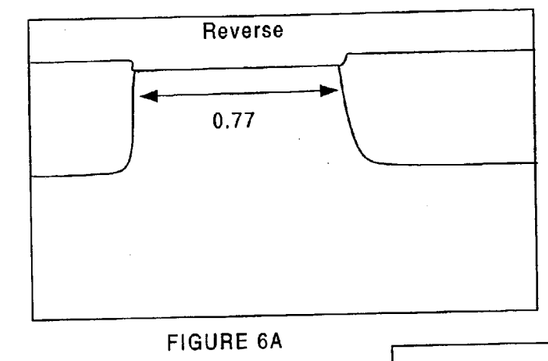
FIGS. 6A–6D depict scanning electron micrographs of vertical cross-sections of a semiconductor wafer processed according to one embodiment of the present invention (6A and 6B) and a semiconductor wafer processed according to conventional CMP-based techniques (6C and 6D) showing active areas of two different regions of each wafer after nitride strips.
Figure 6B:
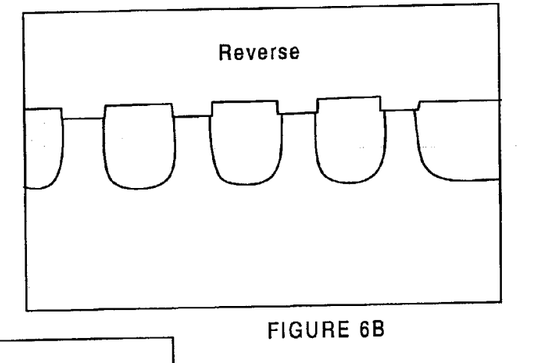
Figure 6C:
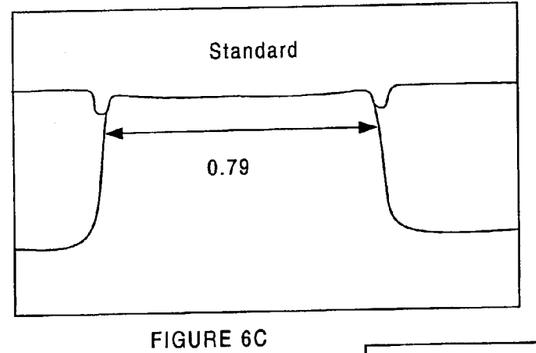
Figure 6D:
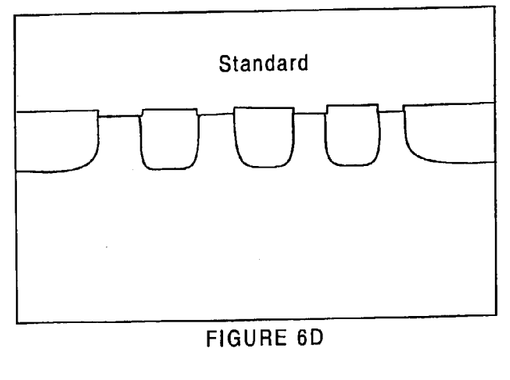

FIGS. 5A–5C depict scanning electron micrographs of vertical cross-sections of semiconductor wafers processed according to one embodiment of the present invention showing the evolution of oxide removal on wide areas with increasing HF etch time (T3>T2>T1). It may be clearly seen that the oxide in the implanted regions is removed faster than the un-implanted regions.

FIGS. 6A–6D depict scanning electron micrographs of vertical cross-sections of a semiconductor wafer processed according to one embodiment of the present invention (6A and 6B) and a semiconductor wafer processed according to conventional CMP-based techniques (6C and 6D) showing active areas of two different regions of each wafer after nitride strips. It may clearly be seen that the processing in accordance with the present invention provides functional overburden removal with results at least as good as with the conventional CMP-based scheme.

Figure 7A:
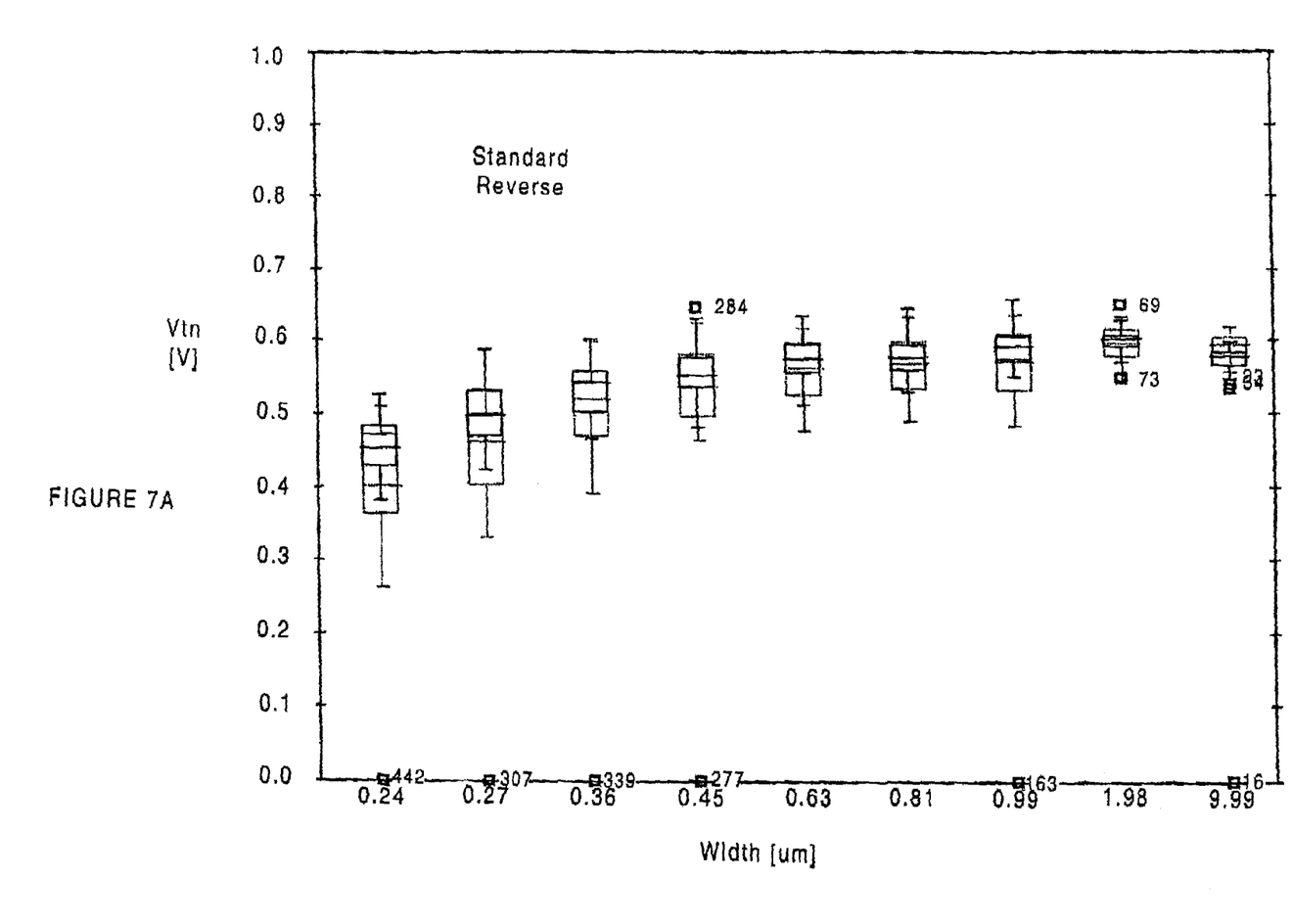
FIGS. 7A–7B depict graphical comparative results of threshold voltage vs. channel length for n-channel (7A) and p-channel (7B) transistors formed according to the present invention and according to conventional CMP-based techniques.
Figure 7B:
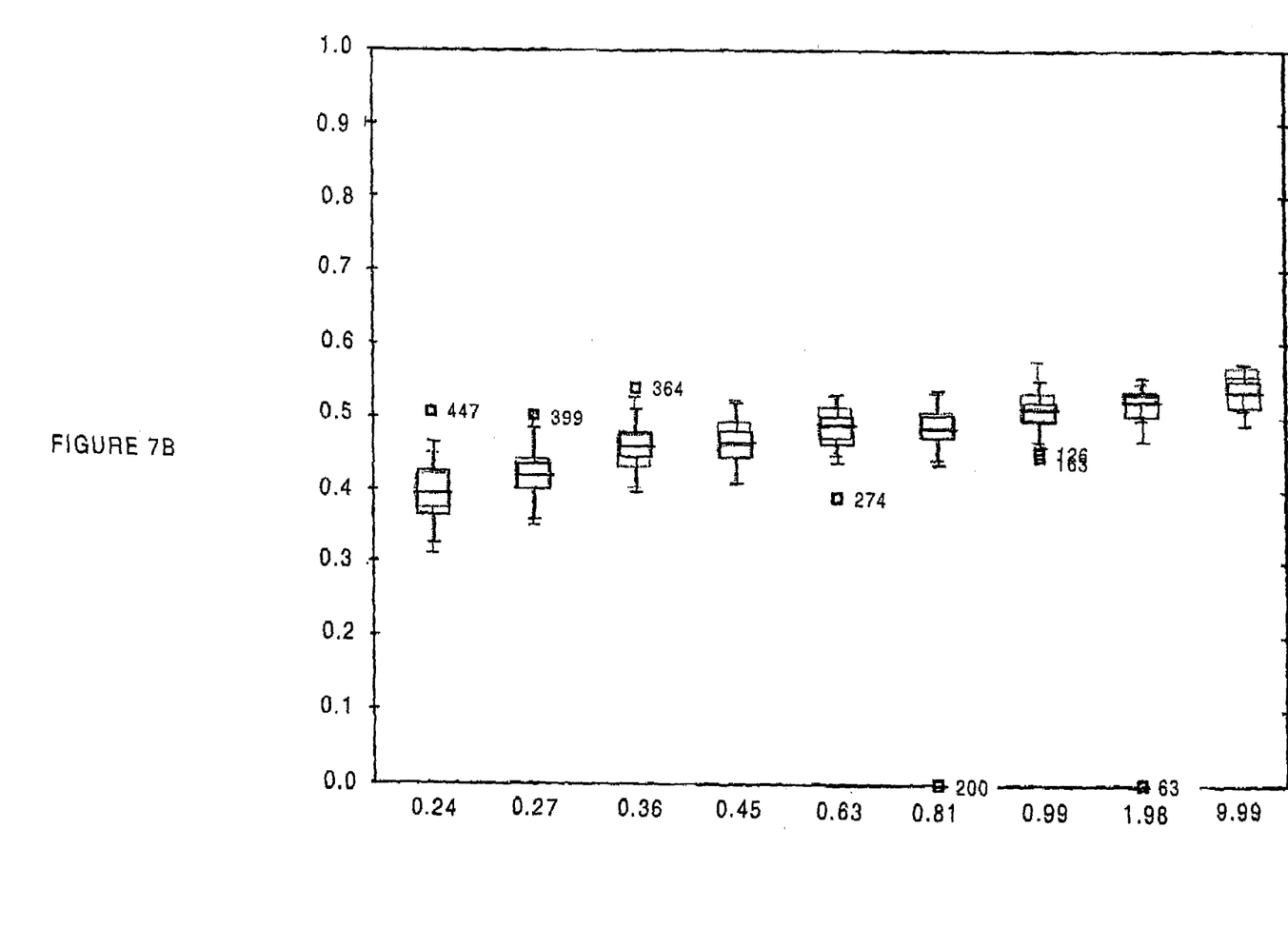

A critical requirement for any shallow trench isolation scheme is to ensure that all structures, irrespective of their drawn width, should function correctly. FIGS. 7A and 7B show transistor threshold voltage vs. drawn channel width for width varying from 10 um down to 0.24 um for n and p channels, respectively. It should be noted that this range encompasses both the reversed and un-reversed regimes (i.e., under the reverse mask generation scheme used for this particular experiment, islands of width under 2 um were not reversed, hence were not implanted). All the tested transistors worked across the tested wafer. This indicates that the scheme works for large reverse/implanted areas, as well as narrow un-implanted areas. In addition, gate oxide reliability studies of area and edge intensive capacitors showed excellent results comparable to the standard process.

In addition to single test transistors, these wafers contained integrated circuits, and the sort yield of the two schemes were comparable, indicating that this scheme is as successful as CMP in clearing large areas.

CONCLUSION

Although the foregoing invention has been described in some detail for purposes of clarity of understanding, it will be apparent that certain changes and modifications may be practiced within the scope of the appended claims. For example, while the specification has been described primarily in terms of STI processes, there is in principle no reason why the invention could not be applied in other semiconductor fabrication processes involving the selective removal of material from some areas while keeping removal in other areas at a minimum. Therefore, the present embodiments are to be considered as illustrative and not restrictive, and the invention is not to be limited to the details given herein, but may be modified within the scope of the appended claims.

What is claimed is:

1. A method of facilitating removal of insulating overburden during semiconductor fabrication, comprising:
    implanting at least a portion of the overburden with an overburden material-damaging ion; and
    removing the overburden by etching, such that the implanted portion of the insulator overburden is removed more rapidly than a non-implanted portion under the same removal conditions.

2. The method of claim 1, wherein said etching is wet etching.

3. The method of claim 2, wherein said wet etching is an HF batch etch.

4. The method of claim 1, wherein the insulating overburden comprises silicon dioxide.

5. The method of claim 4, wherein an etch stop layer underlies the insulating overburden.

6. The method of claim 5, wherein the etch stop comprises nitride.

7. The method of claim 4, wherein the insulating overburden-damaging ions are N ions.

8. The method of claim 7, wherein the N ions are implanted according to the following parameters:
    Damaged layer depth=$32.9 \times (N_{14}$ Implant energy [keV]) $+114.5$ Å.

9. The method of claim 8, wherein the N ions are implanted at a dose of about $3.5e^{14}$ atoms/cm$^2$ and an energy of about 170 KeV.

10. The method of claim 1, wherein the etching is plasma etching.

* * * * *